(12) United States Patent
Miki et al.

(10) Patent No.: US 7,183,856 B2
(45) Date of Patent: Feb. 27, 2007

(54) POWER SOURCE CIRCUIT FOR HIGH FREQUENCY POWER AMPLIFYING CIRCUIT AND SEMICONDUCTOR INTEGRATED CIRCUIT FOR POWER SOURCE AND ELECTRONICS COMPONENT FOR POWER SOURCE

(75) Inventors: Osamu Miki, Komoro (JP); Yasuhiro Nunogawa, Takasaki (JP); Shuji Tomono, Saku (JP); Fumito Moriyama, Saku (JP)

(73) Assignee: Renesas Technology Corp., Tokyo (JP)

( * ) Notice: Subject to any disclaimer, the term of this patent is extended or adjusted under 35 U.S.C. 154(b) by 54 days.

(21) Appl. No.: 10/994,438

(22) Filed: Nov. 23, 2004

(65) Prior Publication Data

US 2005/0122171 A1 Jun. 9, 2005

(30) Foreign Application Priority Data

Dec. 8, 2003 (JP) ............................. 2003-408454

(51) Int. Cl.
*H03F 3/04* (2006.01)
(52) U.S. Cl. ...................................... 330/297; 330/285
(58) Field of Classification Search ................ 330/285, 330/296–297, 127, 129, 199
See application file for complete search history.

(56) References Cited

U.S. PATENT DOCUMENTS 6,825,726 B2 * 11/2004 French et al. ............... 330/297

FOREIGN PATENT DOCUMENTS

| JP | 2002-064339 | 2/2002 |
| JP | 2003-189603 | 7/2003 |

* cited by examiner

*Primary Examiner*—Robert Pascal
*Assistant Examiner*—Hieu Nguyen
(74) *Attorney, Agent, or Firm*—Mattingly, Stanger, Malur & Brundidge, P.C.

(57) ABSTRACT

A power source circuit for a high frequency power amplifying circuit, that can be used for a portable telephone of the GSM or WCDMA and a portable telephone capable of performing communications in two or more communication systems such as the GSM and CDMA. The power source circuit is constructed by a first direct current power source circuit such as a series regulator whose power efficiency is not high but which reaches a high level quickly, and a second direct current power source circuit such as a switching regulator, which does not reach the high level quickly but whose power efficiency is high. When the power source voltage has to reach the high level at high speed, both of the series regulator and the switching regulator are simultaneously operated. When the output power source voltage reaches a predetermined level, the operation of the series regulator is stopped.

6 Claims, 9 Drawing Sheets

FIG. 2(A) START SIGNAL SD (SD')

FIG. 2(B) φP

FIG. 2(C) AMPLIFIER OUTPUT

FIG. 2(D) LOAD (HPA)

FIG. 2(E) OUTPUT VOLTAGE Vdd

FIG. 2(F) OUTPUT VOLTAGE Vdd (WITHOUT AMPLIFIER)

FIG. 4(A) Ramp (SD) (277Hz)
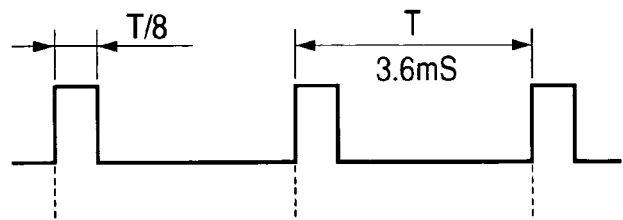
FIG. 4(B) SD'
FIG. 4(C) φP (AMPLIFIER OPERATION)
FIG. 4(D) LOAD (HPA)
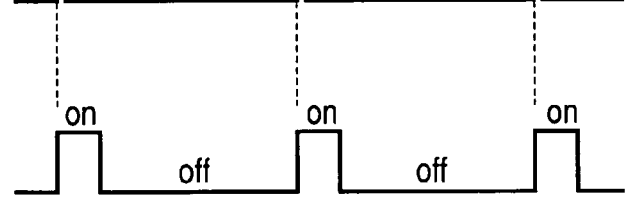
FIG. 4(E) OUTPUT VOLTAGE Vdd
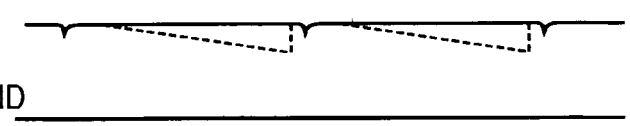
FIG. 4(F) OUTPUT VOLTAGE Vdd (PRIOR ART)
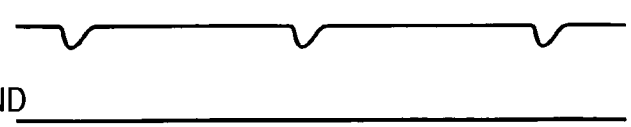

POWER SOURCE CIRCUIT FOR HIGH FREQUENCY POWER AMPLIFYING CIRCUIT AND SEMICONDUCTOR INTEGRATED CIRCUIT FOR POWER SOURCE AND ELECTRONICS COMPONENT FOR POWER SOURCE

CROSS-REFERENCE TO RELATED APPLICATION

The present application claims priority from Japanese patent application No. 2003-408454 filed on Dec. 8, 2003, the content of which is hereby incorporated by reference into this application.

The present invention relates to a technique effective when applied to a power source circuit for a high frequency power amplifying circuit used in a radio communication apparatus such as a portable telephone and to a power source circuit whose power can be controlled. More particularly, the invention relates to a power source circuit which can be used for a portable telephone capable of performing communications in a plurality of communication systems such as the GSM (Global System for Mobile Communication) and the CDMA (Code Division Multiple Access).

At present, as a power source circuit for a high frequency power amplifying circuit of a portable telephone, in a CDMA system, a voltage converting circuit such as a DC—DC converter and a power source switch such as an MOSFET are combined. When output power is low, the power source switch is turned off and a voltage decreased by the DC—DC converter is used. When output power is high, the DC—DC converter is turned off, the power source switch is turned on, and battery voltage is used as it is as the power source voltage to the high frequency power amplifying circuit. With the configuration, the power efficiency of the system is improved as a whole.

In the GSM, a DC—DC converter is not used as a power source circuit for the reason that output power of the GSM is higher than that of the CDMA system and, since the control system peculiar to the GSM requires short start-up time of the power source circuit, a conventional DC—DC converter having low response cannot be used. An invention regarding a power source circuit commonly used for the CDMA system and the GSM is disclosed in, for example, Japanese Patent Laid-open No. 2003-189603. In the invention, a DC—DC converter is used as a power source circuit but, at the time of communication in the GSM, the DC—DC converter is turned off. The invention disclosed in Japanese Patent Laid-open No. 2002-64339 is similar to the present invention but the control method of the invention and that of the present invention are different from each other.

SUMMARY OF THE INVENTION

At present, in a portable telephone of the CDMA system of a narrow band, the operation of a high frequency power amplifying circuit is started by a start signal or bias signal from a baseband circuit. The signal is made active during transmitting operation and does not become inactive during transmission. In the CDMA standard, there is an allowance of 100 microseconds or longer since the start signal is supplied to the high frequency power amplifying circuit until a high-frequency sound signal or data signal is transmitted. In a normal switching regulator, it takes 50 microseconds or longer for outputting the signal. In the CDMA standard as described above, however, the allowance of 100 microseconds or longer is given since the start signal is supplied to the high frequency power amplifying circuit until transmission actually starts. Consequently, power source voltage of the high frequency power amplifying circuit can be generated by using the switching regulator.

However, it is expected that the allowance time since the start signal is supplied to the high frequency power amplifying circuit until a high frequency sound signal and data signal are transmitted is shortened to one fraction of a few portion of the allowance time of the narrow-band CDMA in order to enhance the function. Therefore, the power source voltage of the high frequency power amplifying circuit has to be generated in short time but may not be generated in time by using a normal switching regulator.

On the other hand, in the portable telephone system of the GSM, it is specified to complete increase of output power of the high frequency power amplifying circuit from a level of −25 dBm or lower to +33 dBm within short time such as 23 microseconds. During transmitting operation, the high frequency power amplifying circuit has to be controlled so as to be repeatedly turned on/off at a frequency such as 277 Hz synchronously with a baseband signal (the duty ratio of an on state is ⅛). When the high frequency power amplifying circuit is in the off state, the impedance is high, specifically, the power source circuit is in a no-load state. Consequently, a load state and the no-load state are repeated at the frequency.

In the GMS, the no-load state has to be switched to the load state within a few microseconds. When it is assumed that a switching regulator is used as the power source circuit of the high frequency power amplifying circuit, at the moment the no-load state is switched to the load state, charges are suddenly discharged from a smoothing capacitor at an output end and the output power source voltage drops. By feeding back the change in the output power source voltage, the switching regulator operates so that the output power source voltage becomes the original voltage. However, it takes for a normal switching regulator time of 50 microseconds or longer to increase the output voltage to the original level as described above, so that the power source voltage of the high frequency power amplifying circuit cannot change promptly in response to the start signal and a drop of the voltage for tens of microseconds or longer occurs.

As a method of preventing such a drop in the voltage, a method of improving responsiveness of the switching regulator or a method of increasing the capacitance value of a smoothing capacitor may be employed. It is, however, difficult to design a switching regulator which response in short time as required in the GSM standard by the techniques of these days. Since smaller size and lighter weight of a portable telephone are demanded very much, it is difficult to increase the capacitance value of a smoothing capacitor, which is contradictory to smaller size and lighter weight. When the capacitance value of the smoothing capacitor is increased, first, an inconvenience occurs such that time required to increase an output of the power source circuit increases.

BACKGROUND OF THE INVENTION

An object of the invention is to provide a power source circuit for a high frequency power amplifying circuit, which has excellent responsiveness of an output voltage and can be used for a portable telephone of the GSM or WCDMA system.

Another object of the invention is to provide a power source circuit for a high frequency power amplifying circuit, which can be used for a portable telephone capable of performing communications in two or more communication systems such as GSM and CDMA system and, moreover, has high power efficiency.

Further another object of the invention is to provide a power source circuit for a high frequency power amplifying circuit, which can contribute to smaller size and lighter weight of a portable telephone.

The above and other objects and novel features of the present invention will be apparent from the description of the specification and the appended drawings.

Representative ones of inventions disclosed in the specification will be briefly described as follows.

A power source circuit for a high frequency power amplifying circuit is constructed by using both a first direct current power source circuit such as a series regulator whose power efficiency is not high but which becomes the high level quickly, and a second direct current power source circuit such as a switching regulator, which does not become the high level quickly but whose power efficiency is high. When the power source voltage has to become the high level at high speed, both of the series regulator and the switching regulator are simultaneously operated. When the output power source voltage reaches a predetermined level, the operation of the series regulator is stopped.

The above-described means can be used for a portable telephone performing communications in the GSM and WCDMA requiring high-speed start of the power source of the high frequency power amplifying circuit. The series regulator is turned on for extremely short time immediately after start of the power source and it is sufficient to operate only the switching regulator during transmission operation as the most part. Therefore, the power efficiency can be increased largely as compared with a power source circuit constructed only by the series regulator.

In the case of applying the present invention to a power source circuit for a high frequency power amplifying circuit in a portable telephone capable of performing communications in two or more communication systems such as the GSM and CDMA, in both of operations in the GSM mode and the CDMA mode, an operation voltage can be supplied from a common power source circuit and it is unnecessary to provide a smoothing capacitor of large capacity.

Effects obtained by the representative ones of the inventions disclosed in the specification will be briefly described as follows.

According to the invention, two regulators of different characteristics are used and the regular which starts quickly is operated upon start. Thus, the power source circuit for a high frequency power amplifying circuit, which has excellent responsiveness of an output voltage and can be used for a portable telephone of the GSM or WCDMA system can be realized.

According to the invention, only the switching regulator is operated during transmission operation as the most part except for the time of start. Thus, the power source circuit for a high frequency power amplifying circuit having high power efficiency can be realized.

Further, according to the invention, operation voltage can be supplied from a common power source circuit and it is unnecessary to provide a smoothing capacitor of large capacity. Therefore, the power source circuit for a high frequency power amplifying circuit, which can contribute to reduction in size and weight of a portable telephone can be realized.

BRIEF DESCRIPTION OF THE DRAWINGS

FIG. 4 is a timing chart showing operation timings of the power source circuit in the system of the embodiment of FIG. 3.

DETAILED DESCRIPTION OF PREFERRED EMBODIMENTS

Figure 1:
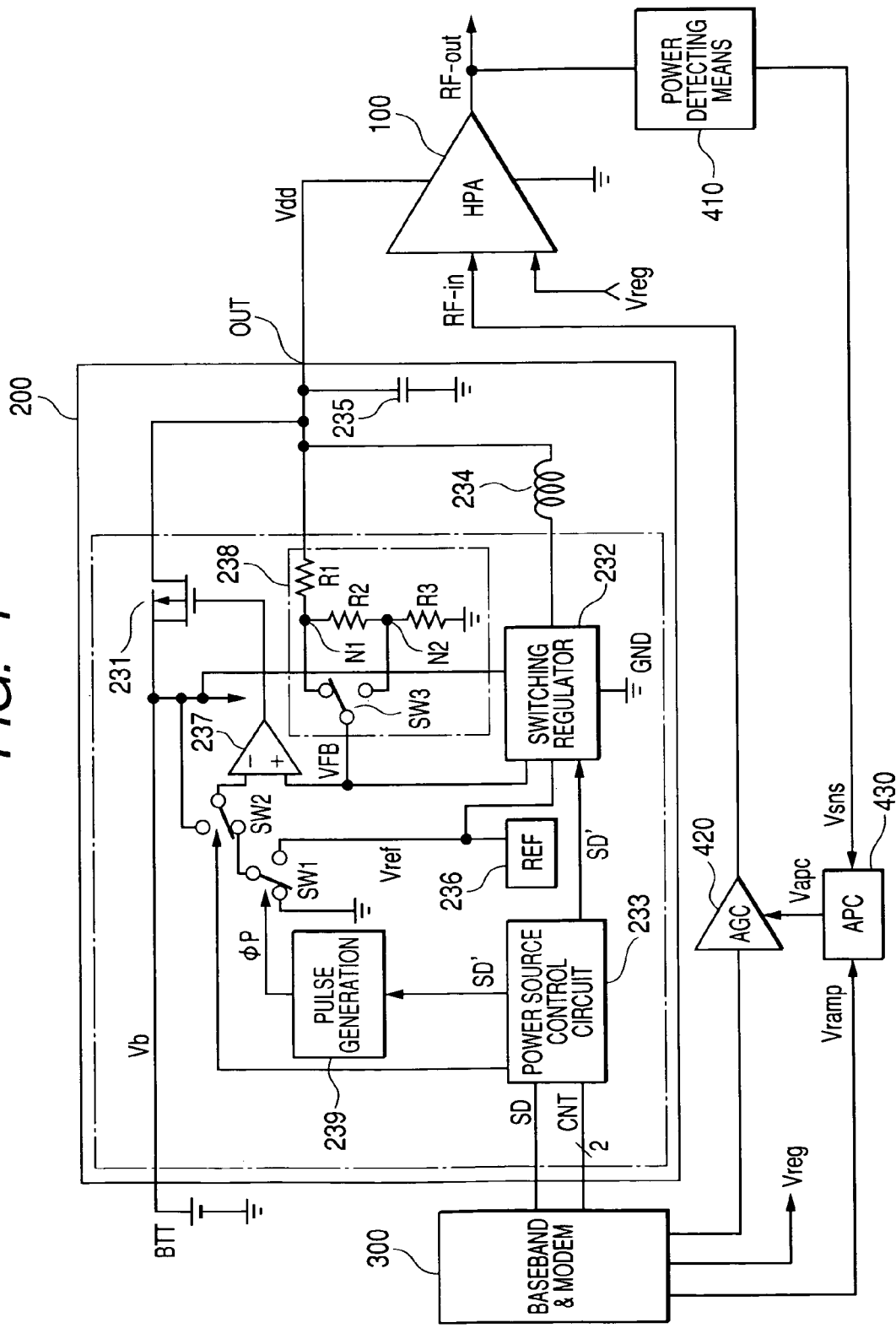
FIG. 1 is a block diagram showing an embodiment of a power source circuit for a high frequency power amplifying circuit according to the invention and a schematic configuration of a system of a portable telephone of the CDMA system using the power source circuit.

Embodiments of the invention will be described in detail hereinbelow with reference to the drawings. In all of the drawings illustrating the embodiments of the invention, the same reference numerals are designated to components having the same functions.

First Embodiment

FIG. 1 shows an embodiment of a power source circuit and a system in the case where the invention is applied to a power source circuit for a high frequency power amplifying circuit of a portable telephone capable of transmitting/receiving data in two systems of the GSM and the CDMA system. FIG. 1 shows an example of the configuration of the CDMA system. The system configuration of the GSM will be described later.

Shown in FIG. 1 are a high frequency power amplifying circuit 100 for amplifying a transmission signal and outputting the amplified signal; a power source circuit 200 for generating a power source voltage Vdd of the high frequency power amplifying circuit 100 on the basis of a power source voltage Vb from a battery BTT; and a baseband & modem 300 constructed by a baseband circuit for converting a sound signal to a baseband signal, converting a reception signal to a sound signal, and generating a transmission/reception switching signal and a modulating system or mode switching signal, and a modulating/and demodulating circuit for demodulating a reception signal, generating a baseband signal, and modulating a transmission signal. The baseband & modem 300 is constructed by a plurality of LSIs and ICs such as a DSP (Digital Signal Processor), a microprocessor, and a semiconductor memory. Although not shown, the transmission signal amplified by the high frequency power amplifying circuit 100 is transmitted from an antenna via a low-pass filter for eliminating harmonics, a transmission/reception change-over switch, and the like.

410 denotes a power detecting means 410 constructed by, for example, a coupler for detecting output power of the high frequency power amplifying circuit 100. 420 denotes a variable gain amplifier (AGC) 420 for amplifying the transmission signal modulated by the baseband & modem 300 in accordance with an output level instruction signal Vramp. 430 denotes an automatic power control circuit (APC) for comparing the output level instruction signal Vramp which is output from the baseband & modem 300 with a signal detected by the power detecting means 410 and generating a voltage for controlling the gain of the variable gain amplifier 420 in accordance with a potential difference. By supplying the output voltage of the automatic power control circuit 430 as a power control signal Vapc to the variable gain amplifier 420, a feedback control to make the output power of the high frequency power amplifying circuit 100 match with the output level instruction signal Vramp from the baseband & modem 300 is performed.

The power source circuit 200 includes: a P-channel MOSFET 231 for voltage control connected between the battery BTT and the power source terminal of the high frequency power amplifying circuit 100; a switching regulator 232 for converting the voltage Vb of the battery BTT; a power source control circuit 233 for generating control signals for the MOSFET 231 and the switching regulator 232; an inductor (coil) 234 connected between the output terminal of the switching regulator 232 and the power source terminal of the high frequency power amplifying circuit 100; and a smoothing capacitor 235 for stabilizing a generated power source voltage. The switching regulator 232 generates a direct current voltage of a desired potential by controlling current flowing in the inductor 234 by the PWM (Pulse Width Modulating) method or PFM (Pulse Frequency Modulating) method. A MOSFET of the P-channel type is used as the MOSFET 231 for voltage control for the reason that, unlike an N-channel type MOSFET, it can increase the output power source voltage Vdd close to the battery voltage Vb. Thus, a power loss can be reduced.

The power source circuit 200 of the embodiment also has: a reference voltage generating circuit 236 such as a band gap reference circuit for generating a reference voltage; a differential amplifying circuit (hereinbelow, simply called an amplifier) 237 for controlling the gate voltage of the MOSFET 231 for voltage control; a resistive divider 238 for dividing the output power source voltage of the power source circuit by resistance and feeding back the resultant to a non-inversion input terminal of the amplifier 237; a change-over switch SW1 for selecting the reference voltage Vref generated by the reference voltage generating circuit 236 or the ground potential and supplying the selected one to the inversion input terminal; a change-over switch SW2 for selecting either the voltage selected by the switch SW1 or the battery voltage Vb and supplying the selected voltage to an inversion input terminal of the amplifier 237; and a one-shot pulse generating circuit 239 for generating a control signal of the switch SW1 on the basis of a start signal SD output from the power source control circuit 233.

The switch SW2 is switched to the battery voltage Vb side when high output is requested in the GSM mode. On the other hand, in the CDMA mode, the switch SW2 is not switched to the battery voltage Vb side. When the switch SW2 is switched to the battery voltage Vb side, the battery voltage Vb is applied to the inversion input terminal of the amplifier 237, so that an output of the amplifier 237 is fixed to the low level. The MOSFET 231 for voltage control is continuously set to the on state and the battery voltage Vb is continuously supplied as the power source voltage Vdd to the high frequency power amplifying circuit 100.

The resistive divider 238 is constructed by bleeder resistors R1, R2, and R3 connected in series between the voltage output terminal OUT of the power source circuit and the ground point GND, and a change-over switch SW3 for selecting the potential of either a connection node N1 between R1 and R2 or a connection node N2 between R2 and R3 and supplying the selected potential to the amplifier 237. By switching the switch SW3 by a control signal from the power source control circuit 233, the voltage fed back to the amplifier 237 is changed. With the configuration, the power source voltage which is output from the power source circuit can be switched in two levels without changing the reference voltage. The power source control circuit 233 generates a switch control signal of the switch SW3 on the basis of the control signal CNT of two bits from the baseband & modem 300.

Although not particularly limited, in the embodiment, parts except for the inductor 234 and the smoothing capacitor 235 of the power source circuit 200 are constructed as a semiconductor integrated circuit (IC) on a single semiconductor chip. This IC and discrete electronic components such as the inductor 234 and the smoothing capacitor 235 are mounted on an insulating substrate made of ceramics or the like on which a wiring pattern is formed, thereby constructing a power source module. The P-channel MOSFET 231 for voltage control may be also constructed by using a discrete electronic component like the inductor 234 and the smoothing capacitor 235. The bleeder resistors R1 to R3 constructing the resistive divider 238 may be also external devices. Printed wiring is conducted on/in the insulating substrate of the module, and a plurality of semiconductor chips and parts mounted on the substrate are electrically connected via the printed wiring and bonding wires so that they are handled just like a single electronic component.

Figure 2:
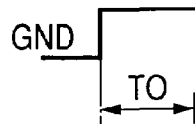
FIG. 2 is a timing chart showing operation timings of the power source circuit in the system of the embodiment of FIG. 1.

The operation of the power source circuit 200 of the embodiment of FIG. 1 will now be described by using the timing chart of FIG. 2.

When the start signal SD from the baseband & modem 300 is set to the high level, the power source control circuit 233 outputs a control signal SD' which changes like the start signal SD to the pulse generating circuit 239 and switching regulator 232. The switching regulator 232 starts operating and the pulse generating circuit 239 outputs a control pulse φp of the high level (or low level) for predetermined time TO (FIG. 2B). By the control pulse φp, the switch SW1 is switched to the side of selecting the reference voltage Vref. Since a feedback signal from the voltage output terminal is close to the ground potential immediately after start, an output of the amplifier 237 becomes low, the MOSFET 231 for voltage control is set to the on state, the battery voltage Vb is supplied as the power source voltage Vdd to the high frequency power amplifying circuit 100 side, and the output power source voltage Vdd rises promptly as shown in FIG. 2E.

At this time, a voltage obtained by dividing the power source voltage Vdd by the resistive divider 238 is fed back to the non-inversion input terminal of the amplifier 237. Consequently, if the voltage obtained by dividing the power source voltage Vdd rises to the reference voltage Vref, the input potential difference of the amplifier 237 decreases, so that an output increases and a control is executed in the direction of turning off the MOSFET 231 for voltage control. That is, the amplifier 237 and the MOSFET 231 for voltage control operate as a series regulator. Therefore, after the power source voltage Vdd rises to a predetermined voltage according to the ratio of the resistors R1 to R3 of the resistive divider 238, the power source voltage Vdd is maintained.

After lapse of predetermined time TO longer than time Ts required for the switching regulator 232 to start and time of the on-state of the high frequency power amplifying circuit 100 as a load, the switch SW1 is switched to the ground potential side. An output of the amplifier 237 changes to a voltage close to the power source voltage and the MOSFET 231 for voltage control is completely turned off. However, the switching regulator 232 is at the high level by this time, even when the MOSFET 231 for voltage control is turned off, the power source voltage Vdd is continuously supplied from the switching regulator 232 side to the high frequency power amplifying circuit 100.

In a power source circuit which does not have the amplifier 237 and is constructed so as to supply the power source voltage Vdd to the high frequency power amplifying circuit 100 only by the switching regulator 232, as shown in FIG. 2F, the power source voltage Vdd becomes the high level later than the power source circuit of the embodiment. In addition, when the bias voltage Vreg is applied to the high frequency power amplifying circuit 100 as a load and operation starts, a phenomenon occurs such that current suddenly flows and the output temporarily drops. In contrast, the power source circuit 200 of the embodiment has an advantage such that the drop of the power source voltage Vdd does not occur as shown in FIG. 2E.

Figure 8:
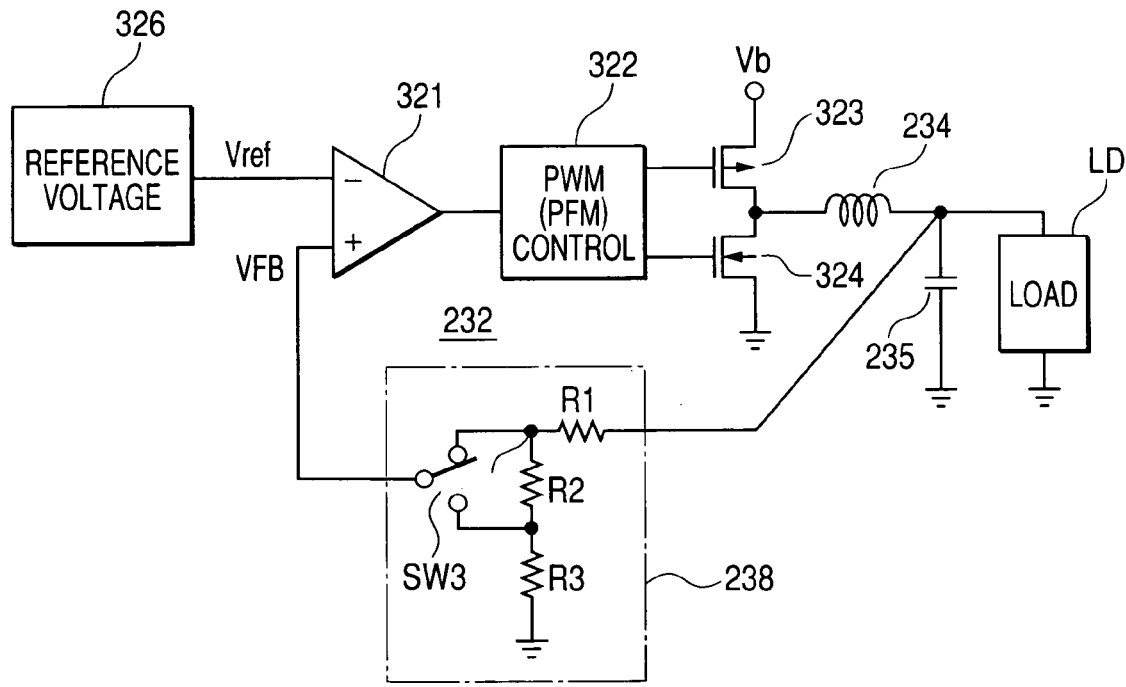
FIG. 8 is a circuit diagram showing a configuration example of a switching regulator as a component of the power source circuit of the embodiment.

The switching regulator 232 comprises, for example, as shown in FIG. 8; an error amplifier 321 for comparing the reference voltage Vref generated by the reference voltage generating circuit 236 with a feedback voltage VFB obtained by dividing the voltage by the resistive divider 238 and outputting a voltage according to the potential difference; a PWM control circuit 322 for generating a pulse having a duty according to the output of the error amplifier; and power MOS transistors 323 and 324 which are on/off driven by a driving signal generated by the PWM control circuit 320. The transistor 324 may be replaced with a diode connected in the opposite direction. In place of the PWM control circuit 322, a PFM control circuit for generating a drive signal of a frequency according to an output of the error amplifier 321 may be also used. In the case of temporarily stopping the operation of the switching regulator 232, both the transistors 323 and 324 are turned off, and the output terminal of the PWM control circuit 322 is held in a high impedance state.

Second Embodiment

Figure 3:
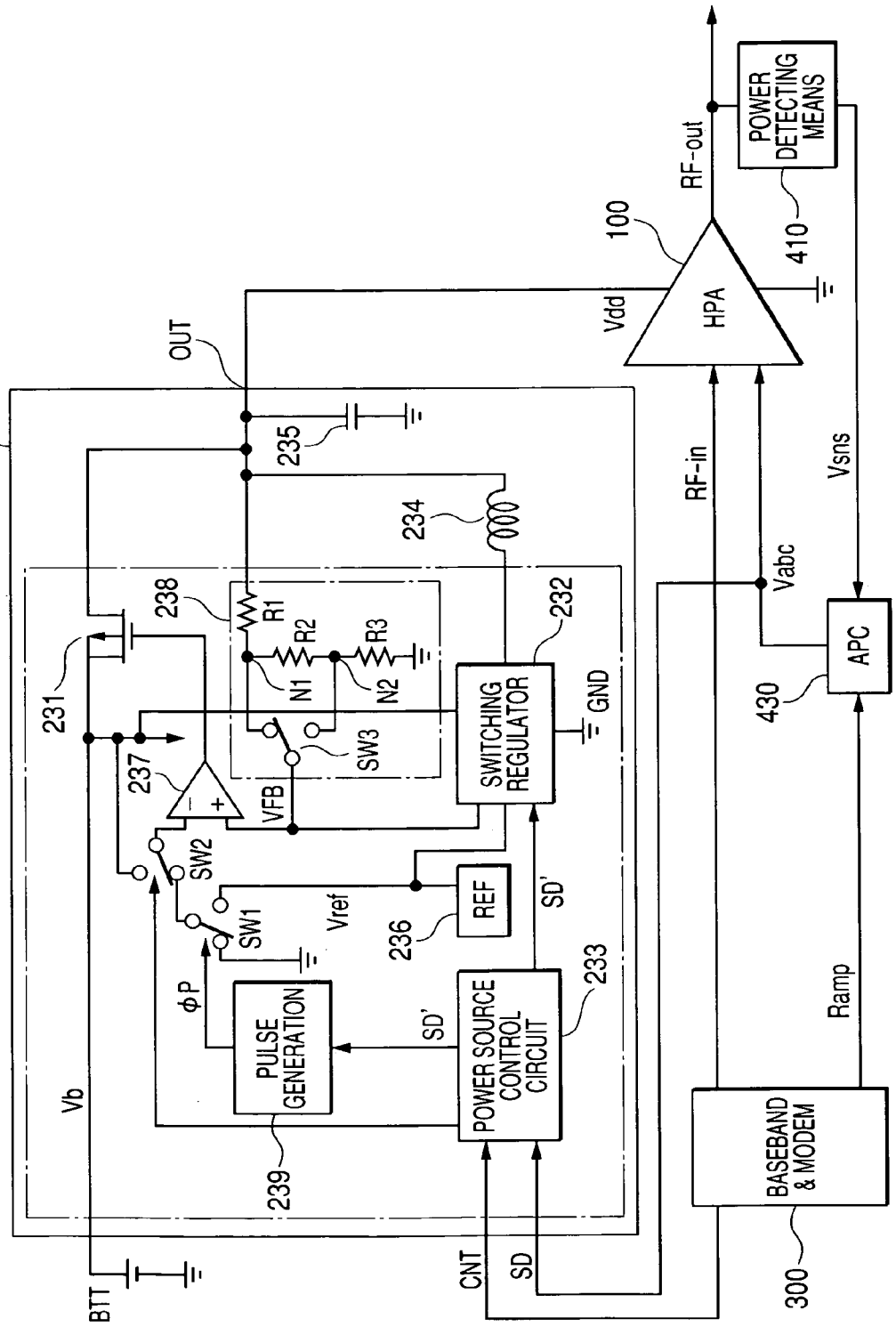
FIG. 3 is a block diagram showing an embodiment of a power source circuit for a high frequency power amplifying circuit according to the invention and a schematic configuration of a system of a portable telephone of the GSM using the same.

FIG. 3 shows an example of a power source circuit and a GSM system of the case where the invention is applied to a power source circuit for the high frequency power amplifying circuit of a portable telephone capable of performing transmission/reception by two systems of the GSM and CDMA. Since the configuration of the power source circuit 200 is the same as that of FIG. 1, its description will not be repeated. In FIG. 3, the same reference numerals are designated to circuits having the same functions as those of FIG. 1 and the description will not be repeated.

As shown in FIG. 3, in the GSM system, a control voltage Vabc obtained by comparing the output level instruction signal Ramp from the baseband & modem 300 with a detection signal Vsns detected by the power detecting means 410 and outputting a voltage according to the potential difference from the automatic power control circuit (APC) 430 is supplied to the high frequency power amplifying circuit 100 and gain control is performed. A high frequency signal RFin as a transmission signal supplied from the baseband & modem 300 to the high frequency power amplifying circuit 100 is a signal having constant amplitude. In the GSM, the control voltage Vabc output from the automatic power control circuit (APC) 430 is supplied as the start signal SD of the power source circuit 200 to the power source circuit 200.

A portable telephone capable of performing transmission and reception in two systems of the GSM and CDMA has a configuration obtained by combining a system as shown in FIG. 1 with a system as shown in FIG. 3. In this case, in a system placing importance on the characteristics, the high frequency power amplifying circuit 100 may be provided for each of the CDMA and GSM. In a system placing importance on smaller size, the high frequency power amplifying circuit 100 may be commonly used. In the embodiment, the control voltage Vabc output from the automatic power control circuit (APC) 430 is supplied as the start signal SD to the power source circuit 200. Alternately, the start signal SD may be supplied from the baseband & modem 300.

The operation of the power source circuit 200 when the request output level in the GSM of FIG. 3 is an intermediate level or low level will be described by using the timing chart of FIG. 4. When the request output level is the intermediate level or low level, the switch SW2 is switched to the switch SW1 side by a control signal from the power source control circuit 233.

In the GSM, the output level instruction signal Ramp instructing the output level at the time of transmission is output from the baseband & modem 300 to the APC circuit 430 every 3.6 milliseconds (277 Hz). The APC circuit 430 receives the output level instruction signal Vramp, compares it with the detection signal Vsns detected by the power detecting means 430, outputs the control voltage Vabc according to the potential difference, and supplies it as the start signal SD to the high frequency power amplifying circuit 100. Consequently, each time the control voltage Ramp rises, the power source control circuit 233 outputs the control signal SD' which changes like the control voltage Vramp to the pulse generating circuit 239 and the switching regulator 232 (FIG. 4B)

The switching regulator 232 starts operating and the pulse generating circuit 239 outputs the cyclic control pulse φp (FIG. 4C). By the operations, the output of the amplifier 237 becomes low only for the period in which the control pulse φP is at the high level, the MOSFET 231 for voltage control is set to the on state and, during the period, the battery voltage Vb is supplied as the power source voltage Vdd to the high frequency power amplifying circuit 100 side. In the GSM, the output level instruction signal Ramp is output as a pulse from the baseband & modem 300 and is generated so that the level of the amplitude of the pulse indicates the request output level.

During the period in which the control pulse φp is at the low level, the MOSFET 231 for voltage control is in a completely off state, and the power source voltage Vdd is supplied from the switching regulator 232 to the high frequency power amplifying circuit 100. During the period in which the output level instruction signal Ramp is at the low level, the operation of the switching regulator 232 is also stopped, the power source voltage just before the stop is held in the smoothing capacitor 235 and, as shown in FIG. 4E, the power source voltage Vdd maintains the almost same potential.

In a power source circuit constructed so that the power source voltage Vdd is supplied to the high frequency power amplifying circuit 100 only by the switching regulator 232 without having the amplifier 237, as shown in FIG. 4F, when the high frequency power amplifying circuit 100 as a load starts operating, a phenomenon occurs such that current suddenly flows and an output drops temporarily. In contrast, the power source circuit 200 of the embodiment has an advantage such that a drop in the power source voltage Vdd is very small as shown in FIG. 4E.

When the request output level is high, the switch SW2 is cyclically switched to the battery voltage Vb side in accordance with the high-level period of the output level instruction signal Ramp, thereby cyclically setting the MOSFET 231 for voltage control to the on state. During the on state, the battery voltage Vb is supplied as it is as the power source voltage Vdd to the high frequency power amplifying circuit 100.

Third Embodiment

Figure 5:
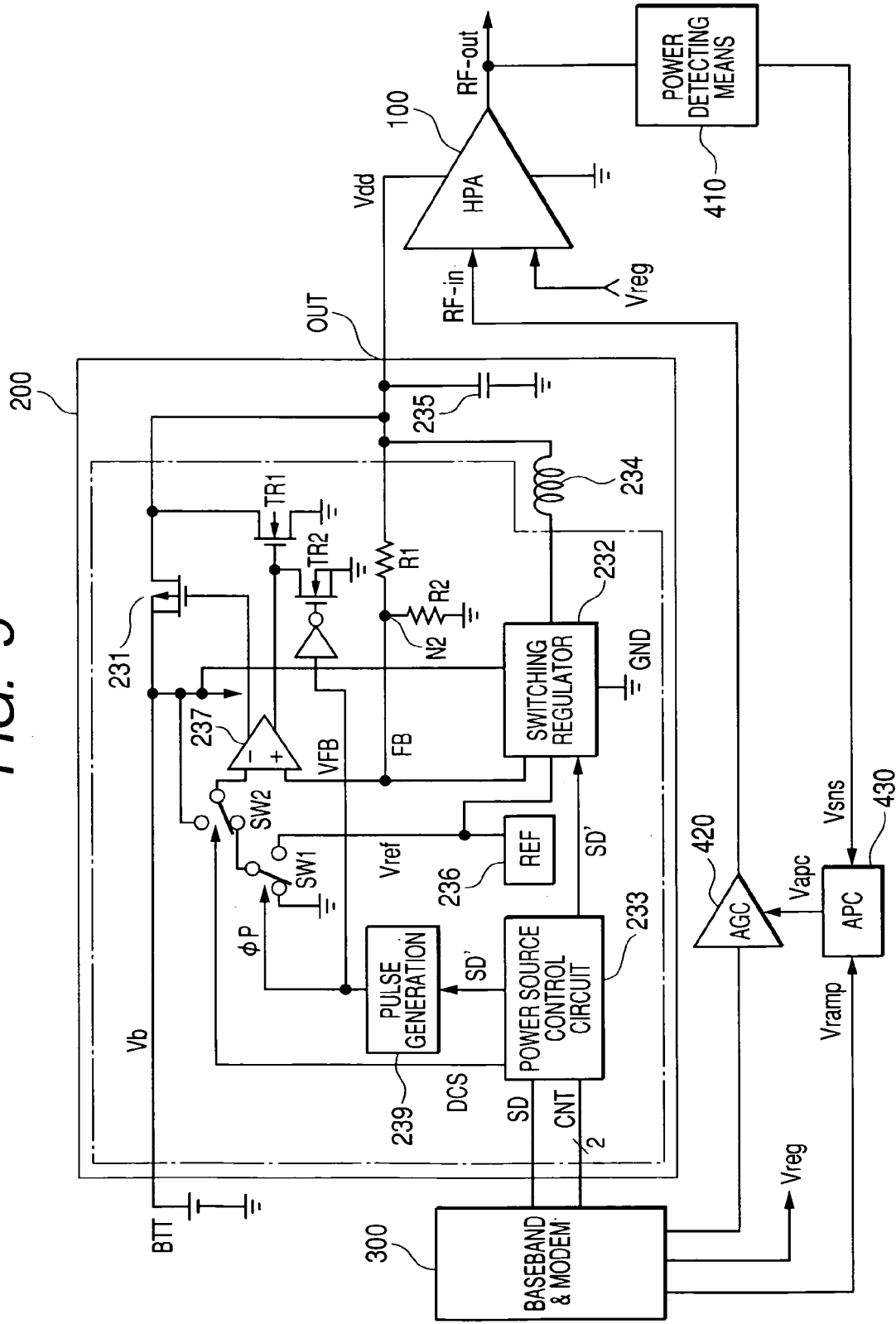
FIG. 5 is a block diagram showing a second embodiment of the power source circuit for a high frequency power amplifying circuit according to the invention.
Figure 6A:
FIG. 6 is a timing chart showing operation timings of the power source circuit in the system using the power source circuit of the embodiment of FIG. 5.
Figure 6B:
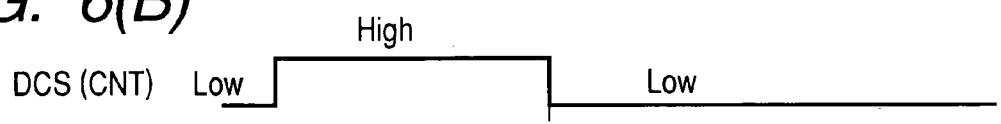
Figure 6C:
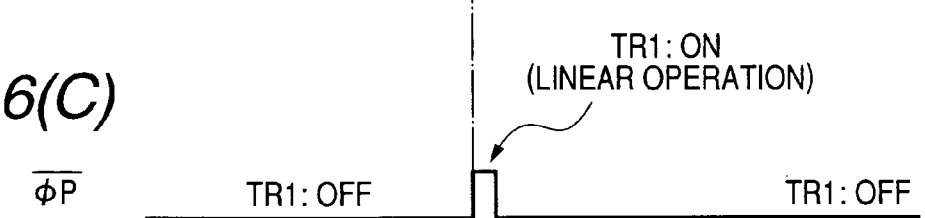
Figure 6D:
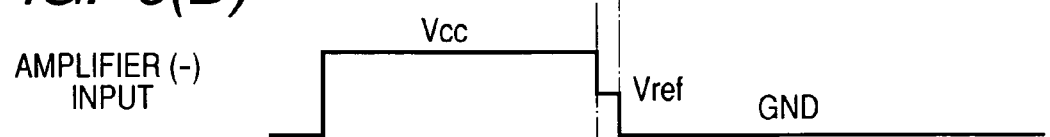
Figure 6E:
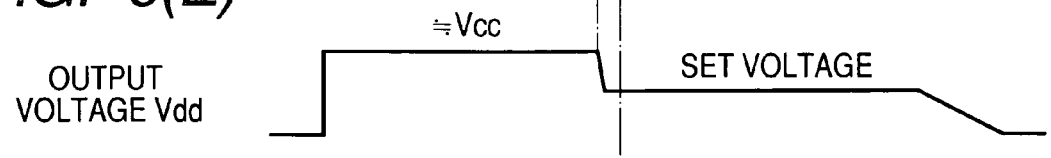
Figure 6F:
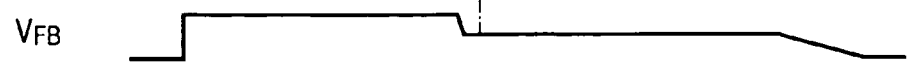

FIG. 5 shows another embodiment of the power source circuit for a high frequency power amplifying circuit of the invention. The configuration of the power source circuit 200 of the embodiment is almost the same as that shown in FIG. 1 except that a MOSFET TR1 for discharge is added between the voltage output terminal of the power source circuit 200 and the ground point and a MOSFET TR2 is added between the MOSFET TR1 and the ground point so that the output power source voltage Vdd can be decreased to a predetermined set potential at high speed when the MOSFET 231 for voltage control is turned off.

In the third embodiment, the MOSFET TR1 for discharge is an N-channel MOSFET and operates complementarily to the P-channel MOSFET 231 for voltage control in accordance with an output of the amplifier 237. As shown in FIG. 6, the MOSFET TR1 is controlled to turn on only for a period ΔT in which the MOSFET TR2 is turned off by a signal/φp obtained by inverting the pulse signal φp generated by the one-shot pulse generating circuit 239 after the control signal DCS becomes the low level. Consequently, when the MOSFET 231 for voltage control is turned off, the output power source voltage Vdd can be decreased to a preset potential Vref·R1/(R1+R2) at high speed.

Fourth Embodiment

Figure 7:
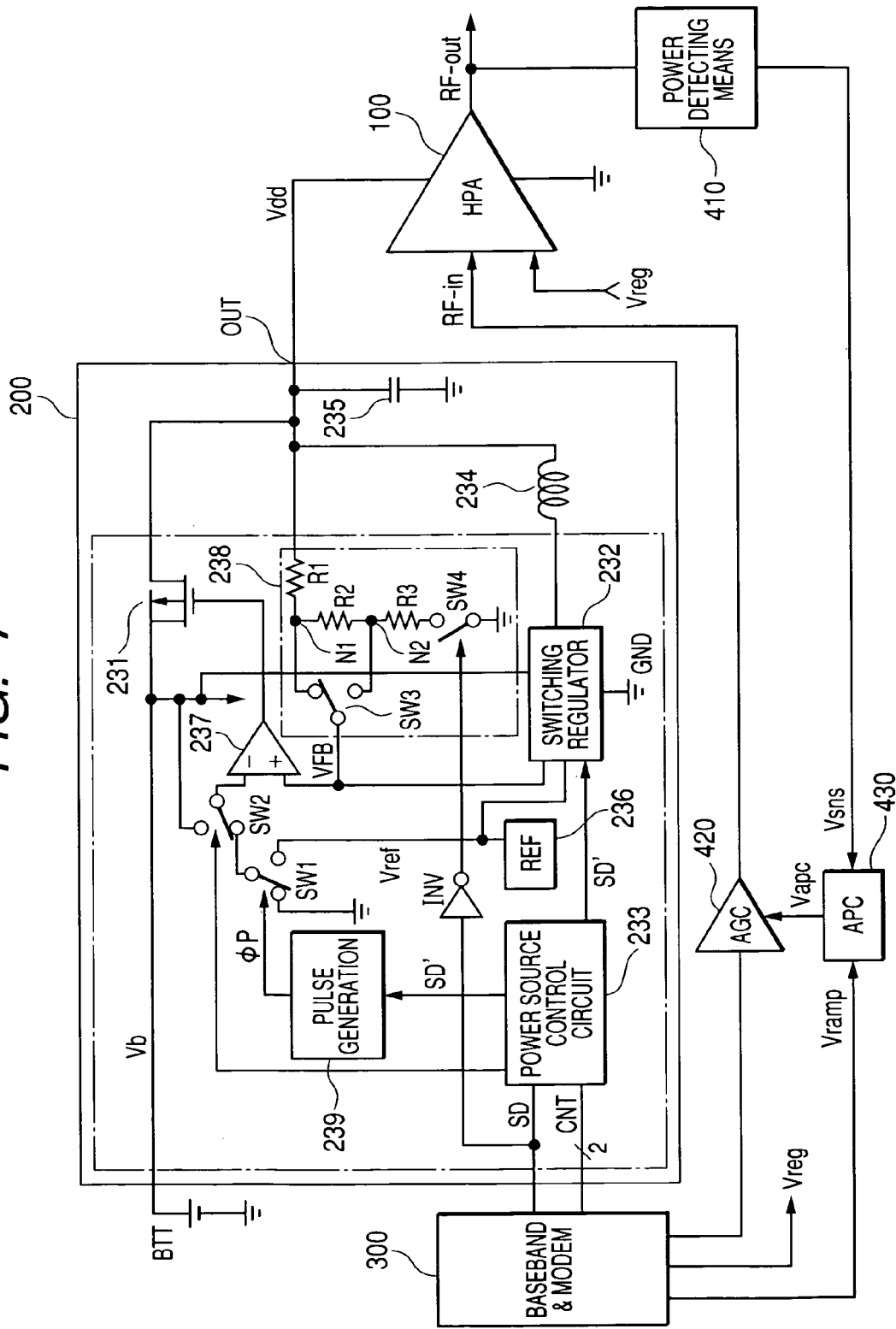
FIG. 7 is a block diagram showing a third embodiment of the power source circuit for a high frequency power amplifying circuit according to the invention.

FIG. 7 shows further another embodiment of the power source circuit for a high frequency power amplifying circuit of the invention. The configuration of the power source circuit 200 of the fourth embodiment is almost the same as that shown in FIG. 1 except that an on/off switch SW4 is provided in series between the resistor R3 of the resistive divider 238 and the ground point so that a path of discharging charges stored in the smoothing capacitor 235 can be interrupted when the power source circuit 200 is turned off. The switch SW4 is turned on/off by a signal obtained by inverting the start signal SD supplied from the outside by an inverter INV. The other configuration is the same as that of FIG. 1, so that the description will not be repeated.

When there is no switch SW4, charges are discharged via the resistors R1 to R3. As shown by a broken line in FIG. 4E, it is feared that the level of the output power source voltage Vdd gradually decreases during the off state of the switching regulator 232. However, by providing the switch SW4 as in the embodiment, the output power source voltage Vdd can be prevented from decreasing. Also in the embodiment of FIG. 3, by increasing the capacitance value of the smoothing capacitor 235 and the resistance values of the resistors R1 to R3, decrease in the output power source voltage Vdd can be suppressed to a degree at which a problem does not occur in practical use. In this case, however, a problem occurs such that reduction in size of the circuit cannot be realized. Thus, the configuration of the embodiment is desirable.

Modifications

Modifications of the foregoing embodiments will now be described.

Figure 9:
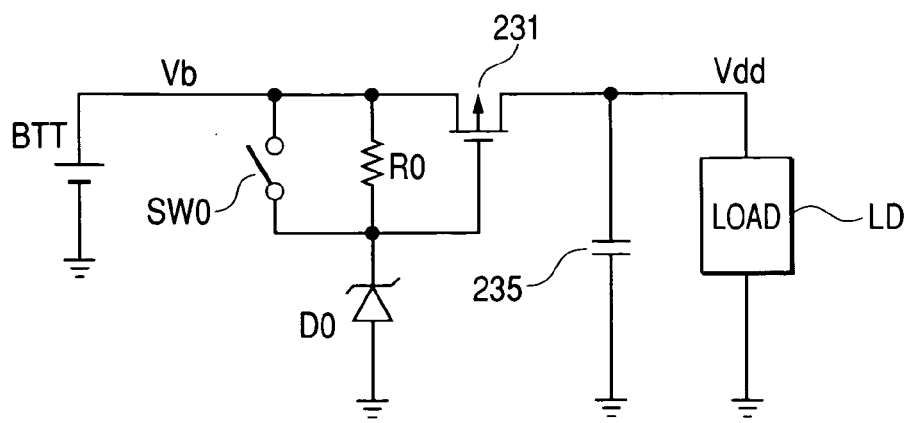
FIG. 9 is a circuit diagram showing a modification of a series regulator as a component of the power source circuit of the embodiment.
Figure 10:
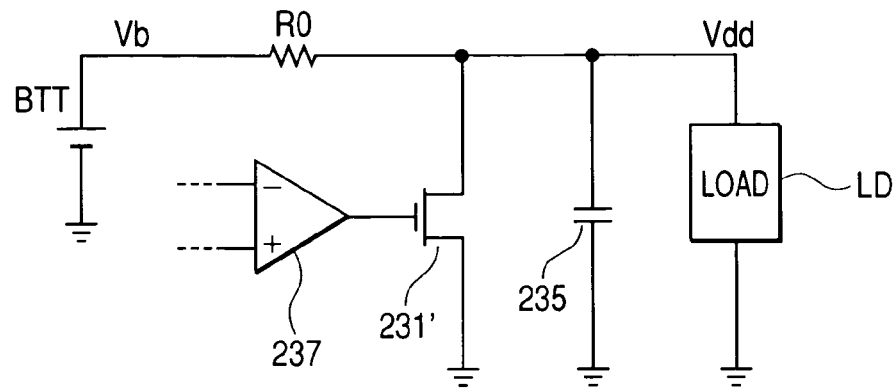
FIG. 10 is a circuit diagram showing another example of a series regulator which can construct the power source circuit of the embodiment.

In the embodiments, an example of using a series regulator constructed by the MOSFET 231 for voltage control and the amplifier 237 for driving the FET 231 has been described above. As the series regulator, alternately, a simple regulator may be used in which the FET 231 is driven by a constant voltage generated by a constant voltage circuit constructed by a resistor R0 and a zener diode D0 connected in series without using the amplifier as shown in FIG. 9. In place of the series regulator, a shunt regulator constructed by the resistor R0 connected to a load LD in series and a MOSFET 231' for voltage control provided in parallel with the load LD as shown in FIG. 10 may be also used.

Figure 11:
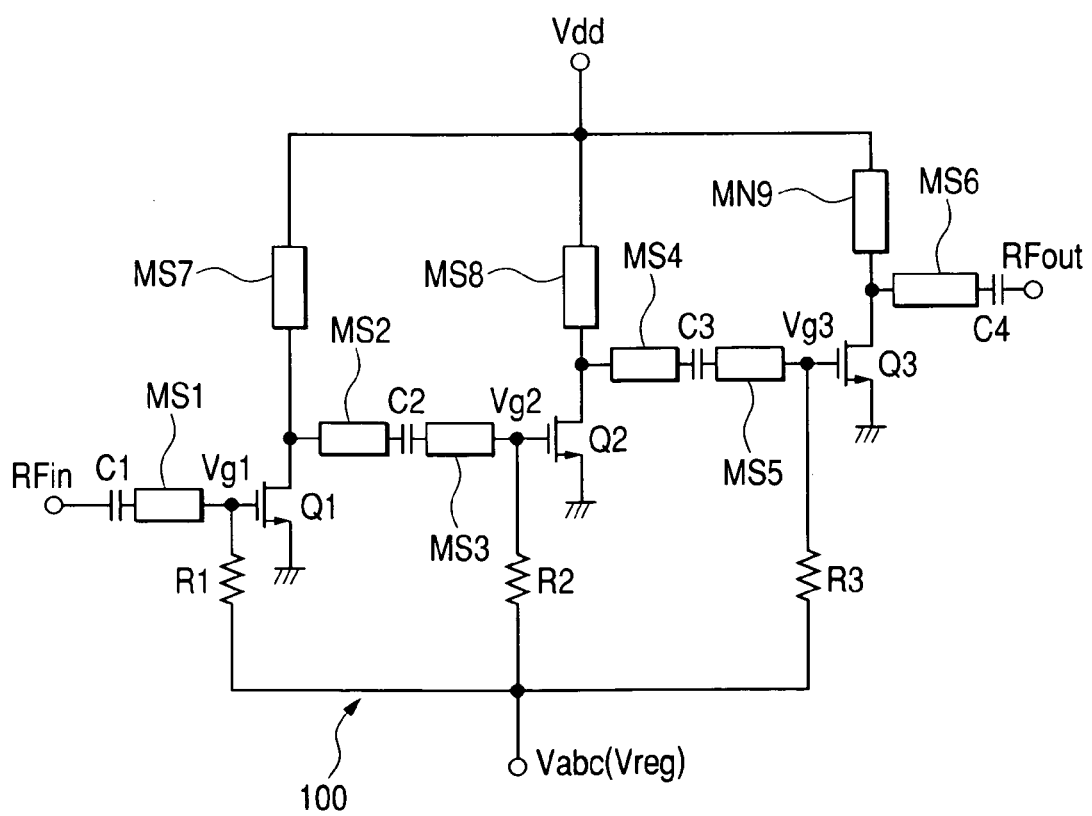
FIG. 11 is a circuit configuration diagram showing a concrete example of a high frequency power amplifying circuit to which a power source voltage is supplied from the power source circuit of the embodiment.

FIG. 11 shows an example of the circuit configuration of the high frequency power amplifying circuit 100. The high frequency power amplifying circuit 100 of the embodiment has a structure in which a plurality of field effect transistors (hereinbelow, also simply called transistors) as active elements are sequentially cascaded in multiple stages. Specifically, the high frequency power amplifying circuit 100 has a three-stage configuration in which the gate terminal of an intermediate-stage transistor Q2 is connected to the drain terminal of a first-stage transistor Q1 and the gate terminal of a final-stage transistor Q3 is connected to the drain terminal of the intermediate-stage transistor Q2.

In the high frequency power amplifying circuit 100 of FIG. 11, the high frequency signal Pin is input to the gate terminal of the first-stage transistor Q1 via the capacitive element C1, and the drain terminal of the final-stage transistor Q3 is connected to the output terminal Pout via the capacitive element C4. Direct current components of the high frequency input signal Pin are cut, alternate current components are amplified, and the resultant signal is output. The output level at this time is controlled by the bias control voltage Vreg and the power source voltage Vdd from a power source circuit 230. The bias control voltage Vreg is supplied as bias voltages Vg1, Vg2, and Vg3 to the gates of the transistors Q1, Q2, and Q3 via the resistors R1, R2, and R3, respectively. The bias control voltage Vreg is supplied from, for example, the baseband & modem 300 in accordance with the required output level.

In FIG. 11, signs MS1 to MS6 denote microstrip lines functioning as inductors for matching impedances of the stages, and MS7 to MS9 express microstrip lines for matching impedances with the power source circuit 200. Capacitors C1, C2, C3 and C4 connected to the microstrip lines MS1 to MS6 in series have the function of blocking the direct current voltage of the power source voltage Vdd and the gate bias voltages (Vg1, Vg2, and Vg3). The high frequency power amplifying circuit 100 of FIG. 11 is just an example. The high frequency power amplifying circuit 100 which operates on the power source voltage from the power source circuit of the invention is not limited to such a configuration.

The invention achieved by the inventors herein has been concretely described above on the basis of the embodiments. Obviously, the present invention is not limited to the foregoing embodiments but may be variously modified without departing from the gist. For example, in the foregoing embodiment, the series regulator and the switching regulator are simultaneously started at the time of setting the output of the power amplifier to the high level and, after predetermined time, only the series regulator is turned off by a one-shot pulse. It is also possible to provide means for detecting the output power source voltage and, at the time point the output power source voltage reaches a predetermined level, turn off only the series regulator. Instead of turning off the series regulator, the driving force of the series regulator may be controlled to decrease.

Although the resistive divider 238 is constructed by the bleeder resistors R1, R2, and R3 and the switch SW3 and the output level is switched in two levels in the foregoing embodiment, the resistive divider 238 may be also constructed to switch the output level in three or more levels. Accordingly, the control signal CNT from the baseband & modem 300 may be a signal of three or more bits.

In the second embodiment, the GSM system has the power detecting means 410 and the automatic power control circuit 430, and the invention is applied to the power source circuit of the closed-loop type of comparing the output level instruction signal Ramp with the detection signal Vsns and controlling the power of the power amplifier 100. By providing a path for supplying the output level instruction signal Ramp to the inversion input terminal of the amplifier 237, the invention can be also applied to an open-loop type power source circuit of controlling the power of the power amplifier 100 only by the power source voltage Vdd from the power source circuit 200 without providing the power detecting means 410 and the automatic power control circuit 430.

Further, in the power source circuit of the foregoing embodiments, it is preferable to provide a filter constructed by ferrite beads and a capacitor between the inductor 234 and the smoothing capacitor 235. By the filter, noise which occurs during the switching operation of the switching regulator 232 can be removed, so that the characteristics of the analog circuit which is mounted on the module together with the switching regulator can be improved.

The present invention achieved by the inventors herein has been described with respect to the power source circuit of a high frequency power amplifying circuit capable of performing communications in two systems of the GSM and CDMA as the field of utilization which is the background of the invention. The invention can be also applied to a power source circuit of a high frequency power amplifying circuit of a portable telephone capable of performing communications, not only in the above two systems but also in a dual-band system capable of handling signals in the frequency band like that of a DCS (Digital Cellular System) of the band of 1710 to 1785 MHz and the CDMA system and, further, a triple-band system capable of handing signals of the PCS (Personal Communication System) of the band from 1850 to 1915 MHz and the CDMA system.

What is claimed is:

1. The power source circuit for a high frequency power amplifying circuit which supplies a power source voltage to the high frequency power amplifying circuit, comprising:

a first direct current power source circuit constructed by a series regulator or a shunt regulator; and a second direct current power source circuit constructed by a switching regulator, wherein the first and second direct current power source circuits being provided in parallel with a voltage output terminal, and a power source terminal being connected to the voltage output terminal, wherein at the time of changing the power source voltage supplied to said high frequency power amplifying circuit in order to change output power of said high frequency power amplifying circuit, both of said first and second direct current power source circuits are started and, after lapse of predetermined time or after the output power source voltage reaches a predetermined level, an operation of said first direct current power source circuit is stopped or power supply capability is lowered, wherein said first direct current power source circuit comprises a transistor in which a channel between a source and a drain is connected between a voltage input terminal and a voltage output terminal or between the voltage output terminal and a ground point, and a differential amplifier connected to a gate terminal of the transistor, and wherein a voltage according to the output power source voltage is fed back to one of input terminals of said differential amplifier, a reference voltage can be applied to the other input terminal of said differential amplifier, and said transistor is operated according to an output of said differential amplifier.

2. The power source circuit for a high frequency power amplifying circuit which supplies a power source voltage to the high frequency power amplifying circuit, comprising:

a first direct current power source circuit constructed by a series regulator or a shunt regulator; and a second direct current power source circuit constructed by a switching regulator, wherein the first and second direct current power source circuits being provided in parallel with a voltage output terminal, and a power source terminal being connected to the voltage output terminal, wherein at the time of changing the power source voltage supplied to said high frequency power amplifying circuit in order to change output power of said high frequency power amplifying circuit, both of said first and second direct current power source circuits are started and, after lapse of predetermined time or after the output power source voltage reaches a predetermined level, an operation of said first direct current power source circuit is stopped or power supply capability is lowered, wherein said first direct current power source circuit comprises a transistor in which a channel between a source and a drain is connected between a voltage input terminal and the voltage output terminal or between the voltage output terminal and a ground point, and a differential amplifier connected to a gate terminal of the transistor, and wherein a voltage according to the output power source voltage is fed back to one of input terminals of said differential amplifier, a reference voltage can be applied to the other input terminal of said differential amplifier, and said transistor is operated according to an output of said differential amplifier, wherein a voltage which is the same as the voltage fed back to one of the input terminals of said differential amplifier is fed back to said second direct current power source circuit, and said second direct current power source circuit operates according to said feedback voltage.

3. The power source circuit for a high frequency power amplifying circuit which supplies a power source voltage to the high frequency power amplifying circuit, comprising:

a first direct current power source circuit constructed by a series regulator or a shunt regulator; and a second direct current power source circuit constructed by a switching regulator, wherein the first and second direct current power source circuits being provided in parallel with a voltage output terminal, and a power source terminal being connected to the voltage output terminal, wherein at the time of changing the power source voltage supplied to said high frequency power amplifying circuit in order to change output power of said high frequency power amplifying circuit, both of said first and second direct current power source circuits are started and, after lapse of predetermined time or after the output power source voltage reaches a predetermined level, an operation of said first direct current power source circuit is stopped or power supply capability is lowered, wherein said first direct current power source circuit comprises a transistor in which a channel between a source and a drain is connected between a voltage input terminal and the voltage output terminal or between the voltage output terminal and a ground point, and a differential amplifier connected to a gate terminal of the transistor, and wherein a voltage according to the output power source voltage is fed back to one of input terminals of said differential amplifier, a reference voltage can be applied to the other input terminal of said differential amplifier, and said transistor is operated according to an output of said differential amplifier, wherein a resistive divider capable of switching a voltage dividing ratio is provided in some midpoint of a feedback path between said voltage output terminal and one of the input terminals of said differential amplifier, and the level of the power source voltage to be output can be switched by switching the voltage to be fed back from the resistive divider.

4. The power source circuit for a high frequency power amplifying circuit which supplies a power source voltage to the high frequency power amplifying circuit, comprising:

a first direct current power source circuit constructed by a series regulator or a shunt regulator; and a second direct current power source circuit constructed by a switching regulator, wherein the first and second direct current power source circuits being provided in parallel with a voltage output terminal, and a power source terminal being connected to the voltage output terminal, wherein at the time of changing the power source voltage supplied to said high frequency power amplifying circuit in order to change output power of said high frequency power amplifying circuit, both of said first and second direct current power source circuits are started and, after lapse of predetermined time or after the output power source voltage reaches a predetermined level, an operation of said first direct current power source circuit is stopped or power supply capability is lowered, wherein said first direct current power source circuit comprises a transistor in which a channel between a source and a drain is connected between a voltage input terminal and the voltage output terminal or between the voltage output terminal and a ground point, and a differential amplifier connected to a gate terminal of the transistor, and wherein a voltage according to the output power source voltage is fed back to one of input terminals of said differential amplifier, a reference voltage can be applied to the other input terminal of said differential amplifier, and said transistor is operated according to an output of said differential amplifier, wherein when the operation of said second direct current power source circuit is stopped, said feedback path is disconnected from a ground potential to shift said voltage output terminal into a high-impedance state, and discharging of charges accumulated in a smoothing capacitor connected to said second direct current power source circuit is suppressed.

5. The power source circuit for a high frequency power amplifying circuit which supplies a power source voltage to the high frequency power amplifying circuit, comprising:

a first direct current power source circuit constructed by a series regulator or a shunt regulator; and a second direct current power source circuit constructed by a switching regulator, wherein the first and second direct current power source circuits being provided in parallel with a voltage output terminal, and a power source terminal being connected to the voltage output terminal, wherein at the time of changing the power source voltage supplied to said high frequency power amplifying circuit in order to change output power of said high frequency power amplifying circuit, both of said first and second direct current power source circuits are started and, after lapse of predetermined time or after the output power source voltage reaches a predetermined level, an operation of said first direct current power source circuit is stopped or power supply capability is lowered, wherein said first direct current power source circuit comprises a transistor in which a channel between a source and a drain is connected between a voltage input terminal and a voltage output terminal or between the voltage output terminal and a ground point, and a differential amplifier connected to a gate terminal of the transistor, and wherein a voltage according to the output power source voltage is fed back to one of input terminals of said differential amplifier, a reference voltage can be applied to the other input terminal of said differential amplifier, and said transistor is operated according to an output of said differential amplifier, wherein a voltage which is the same as the reference voltage applied to the other input terminal of said differential amplifier is applied to said second direct current power source circuit, and said first and second direct current power source circuits operate on the basis of the common reference voltage.

6. The semiconductor integrated circuit for a power source comprising:

a voltage control transistor as a component of a series regulator or a shunt regulator;

a differential amplifier for outputting a voltage which controls said voltage control transistor;

a switching regulator; and a feedback path for feeding back a feedback voltage according to an output power source voltage to one of input terminals of said differential amplifier, wherein said differential amplifier and said switching regulator are started simultaneously and, after lapse or predetermined time or after said output power source voltage reaches a predetermined level, an operation of said switching regulator is stopped or power source supply capability is lowered, and wherein a voltage which is the same as the voltage fed back to one of the input terminals of said differential amplifier is fed back to said switching regulator, a common reference voltage is supplied to the other input terminal of said differential amplifier and said switching regulator, and said differential amplifier and said switching regulator operate according to said reference voltage and said feedback voltage, respectively.

* * * * *